United States Patent
Hein et al.

(10) Patent No.: US 8,591,223 B2
(45) Date of Patent: Nov. 26, 2013

(54) EVAPORATOR FOR ORGANIC MATERIALS AND METHOD FOR EVAPORATING ORGANIC MATERIALS

(75) Inventors: Stefan Hein, Blankenbach (DE); Gerd Hoffmann, Bruchkoebel (DE); Peter Skuk, Nidderau (DE)

(73) Assignee: Applied Materials, Inc., Santa Clara, CA (US)

( * ) Notice: Subject to any disclaimer, the term of this patent is extended or adjusted under 35 U.S.C. 154(b) by 1169 days.

(21) Appl. No.: 12/242,323

(22) Filed: Sep. 30, 2008

(65) Prior Publication Data

US 2010/0081104 A1  Apr. 1, 2010

(30) Foreign Application Priority Data

Sep. 29, 2008 (EP) .................................... 08165435

(51) Int. Cl.
    *C23C 16/02* (2006.01)
(52) U.S. Cl.
    USPC ........................................ 432/210; 427/255.6
(58) Field of Classification Search
    USPC ................. 432/13, 209, 210, 212; 427/255.6; 118/715–733
    See application file for complete search history.

(56) References Cited

U.S. PATENT DOCUMENTS

| | | | |
|---|---|---|---|
| 6,544,600 B2 * | 4/2003 | Affinito et al. | 427/488 |
| 7,192,486 B2 * | 3/2007 | Bang et al. | 118/715 |
| 7,669,349 B1 * | 3/2010 | Palmer et al. | 34/381 |
| 2002/0084958 A1 | 7/2002 | Kim et al. | |
| 2006/0288940 A1 | 12/2006 | Yi et al. | |
| 2008/0173241 A1 | 7/2008 | Priddy et al. | |
| 2011/0027462 A1 * | 2/2011 | Hwang et al. | 427/74 |

FOREIGN PATENT DOCUMENTS

| | | |
|---|---|---|
| CN | 1605652 | 4/2005 |
| CN | 1904130 | 1/2007 |
| EP | 0962260 A1 | 12/1999 |
| EP | 1 273 358 | 1/2003 |
| EP | 1 433 524 | 6/2004 |
| EP | 1433524 A1 * | 6/2004 |
| JP | 2001234335 | 8/2001 |
| KR | 10-2006-0038854 | 5/2006 |
| WO | WO-03/072273 | 9/2003 |
| WO | WO-2007/045215 | 4/2007 |

OTHER PUBLICATIONS

Extended European Search Report dated Jun. 4, 2009 for European Application No. 08165435.2.
International Search Report and Written Opinion of the International Searching Authority mailed Apr. 28, 2010 in PCT/IB2009/006988 (13819P-WO).
Office Action dated Oct. 29, 2012 for Chinese Patent Application No. 2009801383906. (013664CN).

* cited by examiner

*Primary Examiner* — Gregory A Wilson
(74) *Attorney, Agent, or Firm* — Patterson + Sheridan, L.L.P.

(57) ABSTRACT

An evaporator for vaporizing an organic material to be deposited on a flexible substrate where the evaporator includes an evaporation tube having a wall encompassing a cavity for vaporizing the organic material, at least one heating device arranged adjacent to the wall and being adapted to heat the evaporation tube, and at least one nozzle assembly protruding from the evaporation tube. The nozzle assembly further comprises a nozzle cover with an opening, and a shutter for selectively opening and closing the opening of the nozzle cover. The shutter is adapted to have in operation of the evaporation tube a temperature within a shutter temperature range of 140° C. such that the temperature of the nozzle cover is within the shutter temperature range.

18 Claims, 6 Drawing Sheets

EVAPORATOR FOR ORGANIC MATERIALS AND METHOD FOR EVAPORATING ORGANIC MATERIALS

TECHNICAL FIELD OF THE INVENTION

Embodiments of the present invention relate to vaporizing organic materials, e.g., an evaporator for vaporizing organic materials a method for evaporating organic materials. In particular, they relate to an evaporator and methods of operating thereof for vaporizing melamine.

BACKGROUND OF THE INVENTION

Generally, organic materials, like melamine, can be evaporated (sublimated). Typically, the material to be vaporized is arranged in a rectangular crucible, in which the material to be vaporized is disposed. The crucible may be placed into a vaporizer tube that may be heated with a heating element or a heating system. The crucible has to be heated to a temperature such that the organic material evaporates. Typically, the vaporizer tube has an opening through which the vaporized material passes to be deposited on a substrate that is placed adjacent to the opening of the vaporizer tube. Typically, the substrate is placed above the opening. However, thereby, the nozzle evaporators might be clogged by the material to be evaporated.

Thus, it is desired to provide an improved evaporator and an improved method for evaporating the materials. Thereby, for example, a evaporation tube which allows a uniform or homogeneous deposition of vaporized material Further, the coating device should be simple to use and to manufacture and the method should be easy to carry out.

SUMMARY OF THE INVENTION

According to one embodiment, an evaporator for vaporizing an organic material to be deposited on a flexible substrate is provided. The evaporator includes an evaporation tube having a wall encompassing a cavity for vaporizing the organic material; at least one heating device arranged adjacent to the wall and being adapted to heat the evaporation tube; at least one nozzle assembly protruding from the evaporation tube, wherein the nozzle assembly further includes a nozzle cover with an opening; and a shutter for selectively opening and closing the opening of the nozzle cover, wherein the shutter is adapted to have, during operation of the evaporation tube, a temperature within a shutter temperature range of 140° C. such that the temperature of the nozzle cover is within the shutter temperature range.

According to another embodiment, an evaporator for vaporizing an organic material to be deposited on a flexible substrate is provided. The evaporator includes an evaporation tube having a wall encompassing a cavity for vaporizing the organic material; at least one heating device arranged adjacent to the wall and being adapted to heat the evaporation tube; at least one nozzle assembly protruding from the evaporation tube, wherein the nozzle assembly further includes a nozzle cover with an opening; and a shutter for selectively opening and closing the opening of the nozzle cover, wherein the shutter is adapted to have, during operation of the evaporation tube, a temperature which is between a first temperature of 50° C. below the temperature of the nozzle cover and a second temperature of 50° C. above temperature of the nozzle cover.

According to a further embodiment, an evaporator for vaporizing melamine to be deposited on a flexible substrate is provided. The evaporator includes an evaporation tube having a wall encompassing a cavity for vaporizing the melamine; at least one heating device arranged to heat the evaporation tube; the evaporation tube having at least one nozzle assembly, wherein the wall has a mean thermal conductivity of about 200 W/m·K or more, and a thickness of 6 mm or more.

According to yet another embodiment, an evaporator adapted for vaporizing melamine on a flexible substrate is provided. The evaporator includes an evaporation tube having a wall encompassing a cavity for vaporizing the melamine; at least one heating device arranged adjacent to the wall and being adapted to heat the evaporation tube to a temperature in a range of 200° C. to 350° C. and with a temperature uniformity of ±3% of the temperature of the evaporation tube; at least one nozzle assembly protruding from the evaporation tube, wherein the nozzle assembly further includes a nozzle cover with an opening; and a shutter for selectively opening and closing the opening of the nozzle cover, wherein the shutter is adapted to have, during operation of the evaporation tube, a temperature which is between a first temperature of 50° C. below the temperature of the nozzle cover and a second temperature of 50° C. above temperature of the nozzle cover, and wherein either a shutter heater for heating the shutter is provided or the shutter has a thickness of 4 mm or less.

According to yet another embodiment, a method for evaporating melamine is provided. The method includes heating melamine in an evaporation tube to a temperature such that the melamine is vaporized, wherein the evaporation tube includes a wall encompassing a cavity for vaporizing the melamine and at least one nozzle assembly protruding from the evaporation tube, wherein the nozzle assembly further includes a nozzle cover with an opening, and a shutter having a closed position in which the opening of the nozzle is substantially closed and an open position wherein the melamine can pass through the opening; moving the shutter from the closed position to the open position; and heating the shutter to a temperature which is between a first temperature of 50° C. below the temperature of the nozzle cover and a second temperature of 50° C. above temperature of the nozzle cover.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE EMBODIMENTS

Reference will now be made in detail to the various embodiments, one or more example of which are illustrated in the figures. Each example is provided by a way of explanation, and is not meant as a limitation of the invention. Within the following description of the drawings, the same reference numbers refer to the same components. Generally, only the differences with respect to the individual embodiments are described.

Generally, organic materials, e.g., melamine, may be evaporated or sublimated at about 300° C., in particular between about 210° C. and about 320° C., at $10^{-2}$ mbar. In a further embodiment, the organic material is evaporated at about 250° C. and 310° C. Some of the organic materials to be sublimated burn at a temperature slightly higher than the sublimation temperature. For example, melamine burns at about 330° C. Therefore, the temperature of the material to be evaporated has to be controlled. Typically, as the heat has to be provided in a narrow range of a temperature, the evaporation rate of the organic material cannot be significantly increased by increasing the evaporation temperature as the material is not evaporated but burned at higher temperatures. Thus, to provide a uniform or homogeneous coating of the organic material, a heat supply to the organic material may not vary substantially in a function of a location and time.

Figure 1:
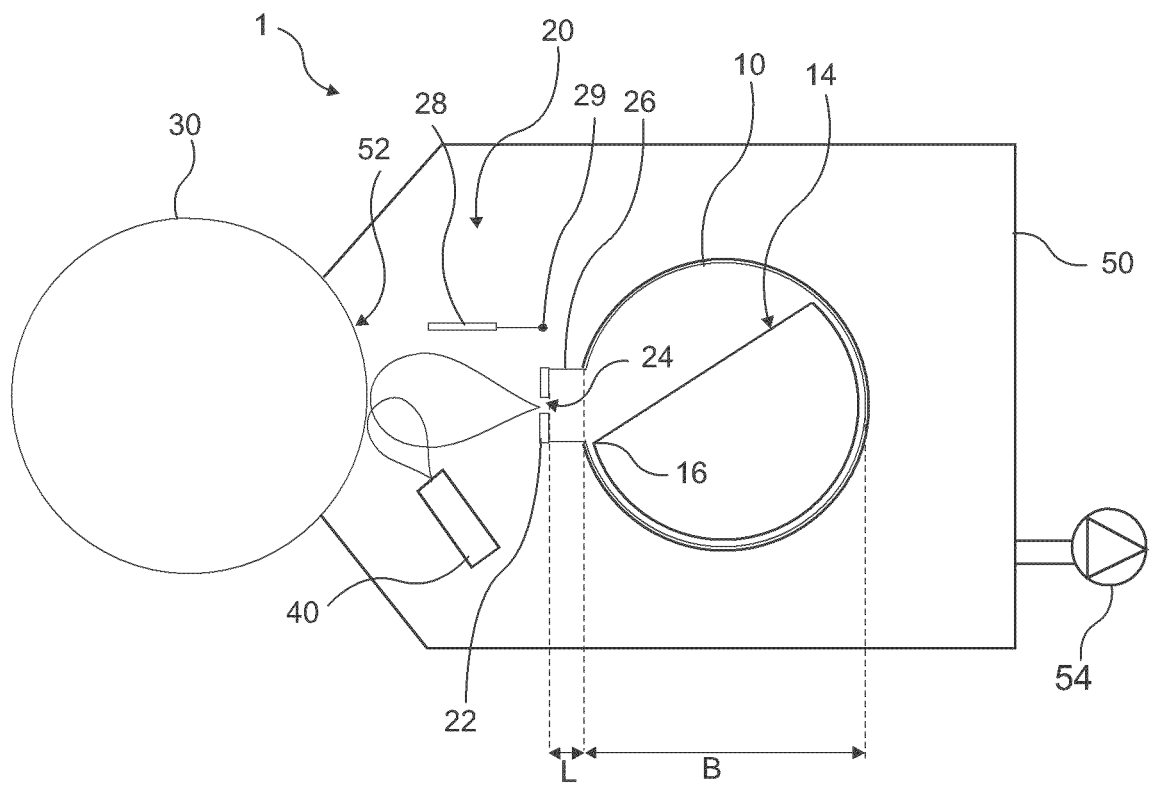
FIG. 1 shows a side view of a vaporizer assembly.

FIG. 1 shows a side view illustrating embodiments of an evaporation assembly. The evaporation assembly 1 includes an evaporation tube 10 and a nozzle assembly 20. A drum 30 supports a flexible web or a substrate onto which the evaporated material is to be deposited. Thereby, for example, the drum 30 may be cooled in order to reduce the heat load on the flexible substrate. The evaporation assembly 1 may further include a chamber 50 housing the evaporation tube and the nozzle assembly. According to some embodiments, which can be combined with other embodiments described herein, a crucible 14 can be provided within the evaporation tube 10. Thereby, a more uniform heating can be realized as compared to embodiments having a similar evaporation tube but do not include a crucible.

According to some embodiments, which can be combined with other embodiments described herein, between the evaporator tube 10 and the drum 30, an adhesion promoter emitter 40 can be arranged such that the adhesion promoter is projected towards the substrate or web to be coated by the material to be evaporated. The adhesion promoter emitter may, for example, be a methanol evaporator. A methanol evaporator is a liquid evaporator with a heated gas guide system and a heated gas lance. The gas lance of the adhesion promoter emitter may be placed such that a cloud of the organic material to be evaporated in the evaporation tube 10 and a cloud of the adhesion promoter are mixed.

The evaporation tube 10, the adhesion promoter emitter 40 and the nozzle assembly 20 may be placed in a common chamber 50 that has an opening 52 which is substantially closed by the drum 30 such that, in an embodiment, a sub-atmospheric pressure may be provided within the chamber 50. According to some embodiments, the pressure inside the chamber may be at about $5\times10^{-3}$ mbar to $1\times10^{-2}$ mbar, typically at about $10^{-2}$ mbar. The pressure within chamber 50 may depend on the material, in particular on the organic material, to be evaporated. FIG. 1 further shows a pump 54 used to evacuate the chamber 50.

The nozzle assembly 20, as shown in FIG. 1, protrudes from the evaporation tube 10. The nozzle assembly 20 includes a nozzle cover 22 having an opening 24 through which the evaporated material from the evaporation tube 10 passes. According to some embodiments, which can be combined with other embodiments described herein, the opening can be provided as a slit opening through which the evaporated material, e.g., melamine passes in operation. Further, the nozzle assembly may include a guiding channel 26 for guiding vaporized material from the evaporation tube 10 to the opening 24 of the nozzle cover. The opening 24 of the nozzle cover 22 may be selectively opened or closed by a shutter 28. The shutter 28 may be moved from an open position in which the nozzle opening 24 is open, such that evaporated material can pass there through and be deposited on the substrate or the web, to a closed position, in which the evaporated material is prevented to pass through the nozzle opening 24, by pivoting about an axis 29. According to yet further embodiments, which can be combined with other embodiments described herein, other moving mechanisms may be used. For example, the shutter 28 may be moved by in a linear movement from the open position to the closed position.

Figure 2:
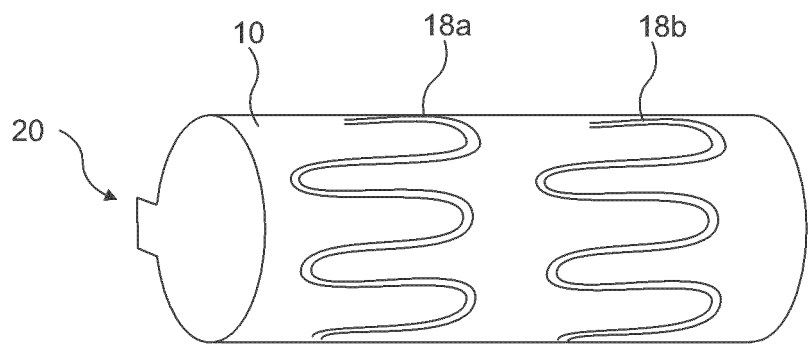
FIG. 2 shows a perspective view of an evaporation tube.

As it can be seen from FIG. 1 and FIG. 2, according to some embodiments, the evaporation tube 10 has a substantial cylindrical form. A cylinder may be formed, according to an embodiment, by two parallel plane surfaces and a surface that is formed by parallel straight lines. In a typical embodiment, the evaporation tube is formed by a cylinder that has a ruled surface spanned by a one-parameter family of parallel straight lines. A surface is ruled if through every point of the surface there is a straight line that lies on the surface. Thus, according to different embodiments, which can be combined with any of the embodiments described herein, the cylinder may have a circular base surface or a non-circular bases surface. According to typical embodiments, the cylinder can be a circular cylinder.

Typically, in operation, the evaporation tube 10 has a substantial horizontal cylinder axis. The cross section of the evaporation tube has, therefore, two lateral quadrants, an upper quadrant and a lower quadrant. As it can be seen in FIG. 1, the nozzle assembly is arranged at the left lateral quadrant of the evaporation, such that the evaporation tube 10, and in particular the nozzle assembly 20 of the evaporation tube 10, directs in operation the vaporized organic material in a substantially horizontal direction. The nozzle assembly 20 is arranged in longitudinal direction of the evaporation tube. Thus, the opening 24 of the nozzle assembly 20 may form a slit opening, the slit having a longitudinal direction parallel to the cylinder axis of the evaporation tube. Thus, according to some embodiments, which can be combined with other embodiments described herein, a horizontal cylinder having a horizontal cylinder axis, and a horizontal opening 24 can be provided.

As shown in FIG. 1, the evaporation tube or vaporizer tube has a mean with B, and the guiding channel 26 having a length L in guiding direction, i.e., in the direction from the vaporizer tube 10 to the nozzle opening 24. Thereby, according to some embodiments, which can be combined with other embodiments described herein, the ratio B/L can be at least 5. In a typical embodiment, the length L can be between from about 30 mm to about 60 mm, in particular about 40 mm. With such a length, the guiding channel may be passively heated by a heating device of a nozzle cover and/or a heating device of the evaporation or vaporizer tube 10. In operation, the guiding channel may be passively heated to a temperature close to the evaporation temperature of the material to be evaporated in the evaporation tube. Passively heating means that no heating device is disposed at or in an outer wall of the guiding channel 26, i.e., the heat is transferred from the nozzle cover and/or the evaporation tube to the guiding channel 26 by heat transfer. Thus, a desublimation or condensation of the material to be evaporated on the wall of the guiding channel 26 during operation of the vaporizer tube 10 is prevented by passively heating the guiding channel and providing the guiding channel at a sufficiently small length.

FIG. 2 shows a perspective view of the evaporation tube 10. On the outer surface of the evaporation tube 10, heating devices or heaters 18a, 18b are arranged to heat the evaporation or vaporizer tube 10. In FIG. 2, two heating elements are shown, one spatially disposed after the other in longitudinal axial direction of the evaporation tube. The two heating elements 18a, 18b shown in FIG. 2 may be controlled separately to provide a uniform heat distribution along the longitudinal axis of the vaporizer tube 10. In further embodiments, three or more heating elements may be placed spatially disposed one after the other along the longitudinal axis of the evaporation tube. With such an arrangement, the temperature for vaporizing the organic material may be accurately controlled in the direction of the longitudinal axis of the evaporation tube 10. Thus, the homogeneity of the deposition of the vaporized material along the longitudinal axis of the evaporation or vaporizer tube 10 can be improved.

As shown in FIG. 1, a crucible 12 can be arranged in the evaporation tube 10. The crucible 12 is provided to contain the organic material to be vaporized and is shown in more detail in FIG. 3 below. The crucible 12 has an open side 14 such that the vaporized material can easily pass from the crucible placed into the evaporation tube 10 via the guiding channel 26 and the nozzle opening 24 on the flexible web or substrate to be coated. The crucible 12 is typically placed into the evaporation tube 10 such that an edge 16 of the crucible 12 is arranged just below or close to the guiding channel 26 of the nozzle assembly 20.

Figure 3:
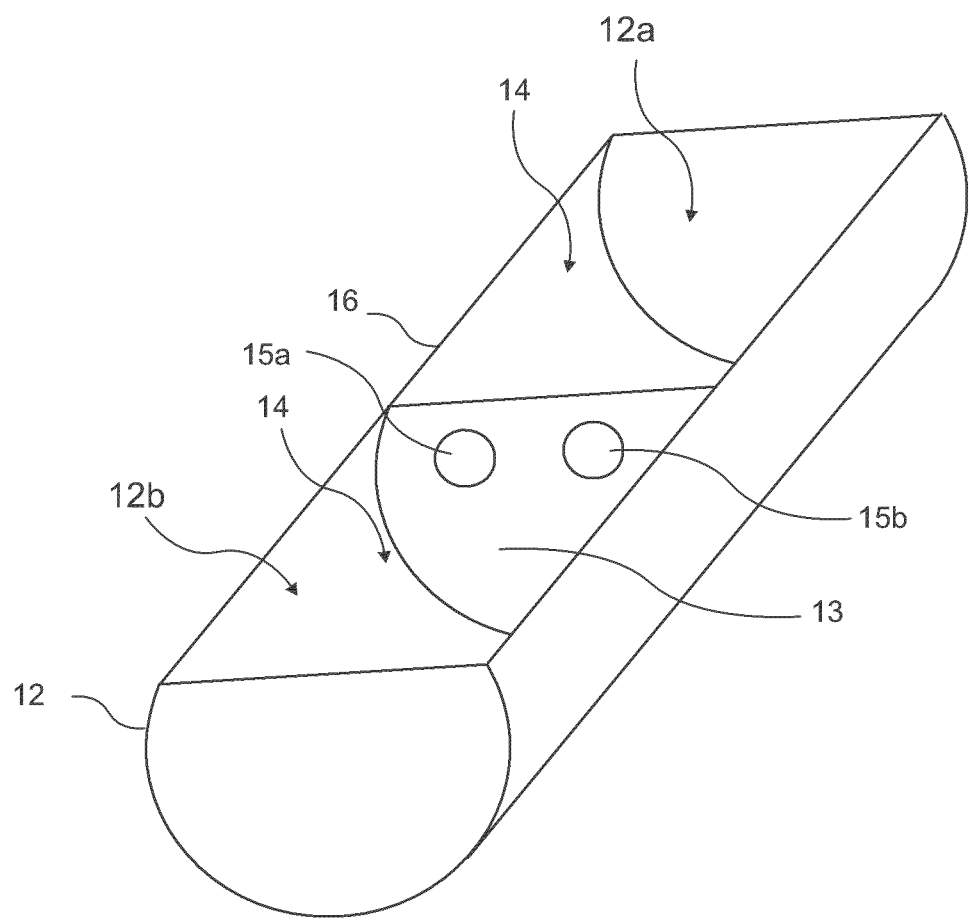
FIG. 3 shows a crucible for material to be vaporized.

FIG. 3 shows a crucible 12 for insertion into the evaporation tube 10. According to some embodiments, the crucible 12 has a substantially cylindrical form with at least an opening 14 on one side of the crucible, e.g., the upper side in FIG. 3. The crucible 12 has two areas 12a, 12b that are separated by a wall 13. The wall 13 may have one or more apertures 15a, 15b, typically two apertures. The aperture 15a, 15b permits a gas exchange between the two areas 12a, 12b. According to some embodiments, which can be combined with other embodiments described herein, when the crucible 12 is placed into the evaporation tube 10, the cross section of the crucible has a portion opposed to a portion of the cylindrical surface of the evaporation tube 10, wherein the portion of the cylinder base surface of the crucible, i.e., the cross section with respect to the longitudinal axis of the evaporation tube, has a similar shape as the opposing portion of the cross-section of the evaporation tube 10. As it can be seen in FIG. 1, this allows that the portion has a substantial uniform heat transfer between the evaporation tube 10 and the crucible 12. According to some embodiments, the portion can be at least 20%, typically at least 50% of the cylindrical, cross-sectional surface which does not correspond to the opening of the crucible. In a further embodiment, the portion is at least 75%, in particular at least 90% of the cylindrical surface of the crucible 12, which does not correspond to the opening of the crucible. Therefore, a heat transfer from the evaporation or vaporizer tube 10 to the crucible 12 is improved and a more homogeneous heat distribution in cross section of the evaporation tube is provided at least along the cross-sectional portion of the crucible 10 opposing the portion of the cylindrical surface of the evaporation or vaporizer tube 10. According to some embodiments, which can be combined with other embodiments described herein, the corresponding cylinder cross-sectional surfaces of the crucible and the evaporator tube may, in particular, be used for evaporation of melamine or other organic materials, for which the temperature range from an evaporating temperature to a burning temperature is small, e.g., below 70° C., or for which the temperature range from a desired evaporating temperature to a burning temperature is small, e.g., below 50° C. or even 30° C.

Thereby, the temperature window, which might be desired for operation, is about 50° C. or smaller such as about 30° C. In light of the small temperature window, temperature fluctuations of a few degrees centigrade result in a large percentage of the temperature window for evaporation. Accordingly, a uniform evaporation rate is difficult to obtain for melamine and other organic materials having a small temperature window for evaporation. Thus, the above-described uniform heat transfer between the crucible and the evaporation tube, which can be realized by having corresponding cylindrical cross-sectional surface portions, i.e., a uniform heat contact along, e.g., at least 10% of the cross-sectional surface, can be used advantageously for melamine or the like.

Figure 4:
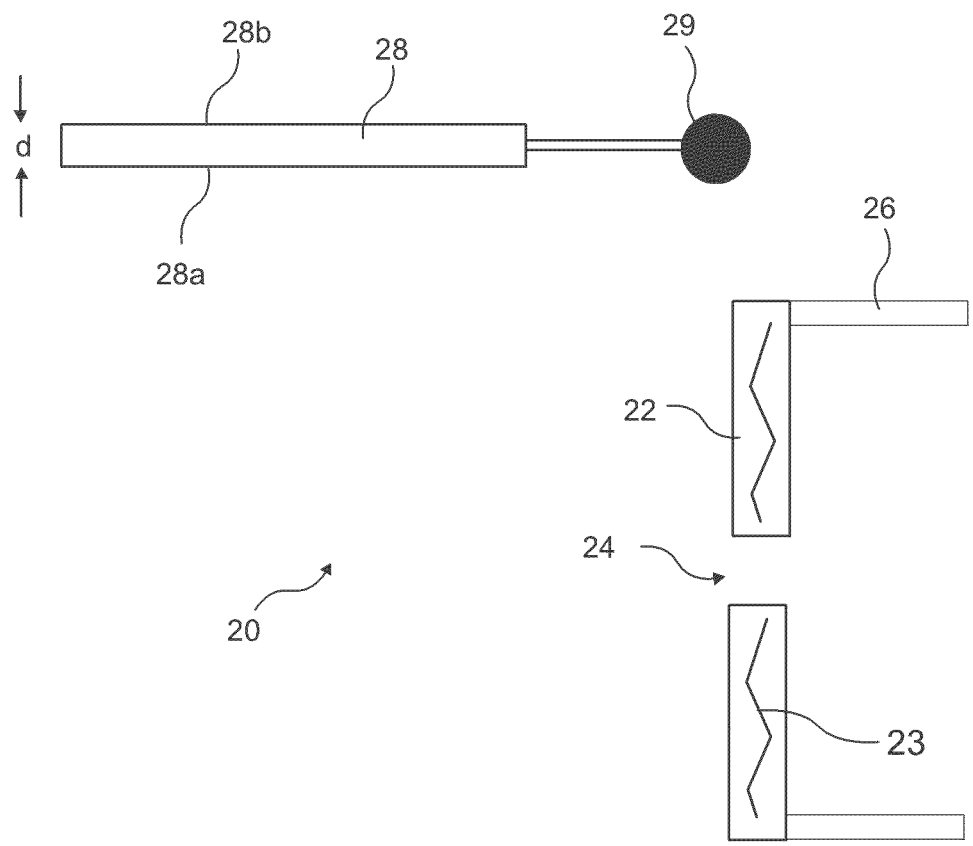
FIG. 4 shows an enlarged side view of the nozzle assembly.

FIG. 4 shows an enlarged view of the nozzle assembly 20. The nozzle cover 22 can, according to some embodiments, be releasably connected to the guiding channel 26. Thus, in case material has been condensed or desublimated on the nozzle cover 22, the nozzle cover may be replaced. The nozzle cover may be connected to the guiding channel 26 by screws or bolts. In a further embodiment, the nozzle assembly is clamped on the guiding channel 26. In a further embodiment, the nozzle cover 22 is plugged on the guiding channel 26, such that the nozzle cover is held substantially by frictional forces on the guiding channel 26. Also, a combination of several connection techniques may be used.

Further, according to some embodiments, which may be combined with other embodiments described herein, the nozzle cover 22 is provided with a heating device 23. Therefore, cooling of the vaporized material due to the lower temperature of the nozzle cover, and resulting condensation or desublimation on the nozzle cover 22 is reduced. In a typical embodiment, the nozzle cover 22, in particular the portions of the nozzle cover adjacent to the opening 24, are heated up to a range of ±30° C. around the sublimation temperature of the organic material to be vaporized. For example, the nozzle cover may have adjacent to the nozzle opening a temperature of 210° C. to 320° C., in particular a temperature of 250° C. to 300° C. In a further embodiment, only a portion of the nozzle cover 22 around the opening 24 is heated by the heating device 23.

As described above, according to yet further embodiments, the nozzle opening 24 may be closed by a shutter 26. Thereby, the shutter may be configured to have in operation a temperature, such that evaporated organic material does not condensate or desublimate on the shutter 26 and/or the nozzle cover 22. In particular, the temperature of the shutter 26 can be about the same or more than the temperature of the nozzle cover 22.

According to yet further embodiments, which can be combined with other embodiments described herein the shutter can be configured to have in operation of the evaporation tube a temperature within a range of 140° C., wherein the temperature of the nozzle cover is within that range. That is, the shutter can be configured to have a temperature, which is about the temperature of the nozzle cover, for example, which is between a temperature of 50° C. below the temperature of the nozzle cover and a temperature of 50° C. above temperature of the nozzle cover. Typically, the temperature can be between a temperature of 30° C. below the temperature of the nozzle cover and a temperature of 30° C. above temperature of the nozzle cover.

According to some embodiments, which can be combined with other embodiments described herein, the shutter is provided to be heated during operation and/or to have a short heat up time period when closed during operation.

According to some embodiments, the shutter has a first side 28a and a second side 28b, the first side is opposing the opening 24 of the nozzle cover 22 in case the shutter 28 is in the closed position. In a first embodiment, the first side 28a of the shutter 28 has a heat-conductivity greater than approximately 15 W/m·K, e.g., 50 W/m·K or more, and/or the heat capacity of the first side is smaller than approximately than $7.8 \times 10^3$ kJ/K per m².

In such a configuration, the first side of the shutter 28 can be heated by the temperature of the environment adjacent to the first side 28a of the shutter 28 in operation of the evaporator tube 10. Further, the first side 28a of the shutter 28, the shutter being designed to have a high heat conductivity and/or low heat capacity, such that when the shutter 28, in particular the first side 28a of the shutter 28, comes in contact with the nozzle cover 22, the first side 28a of the shutter is heated immediately to about the same temperature as the temperature of the nozzle cover 22. Accordingly, desublimation of the evaporated material on the shutter and/or the nozzle cover may be reduced or avoided.

According to some embodiments, the shutter 28, in particular the first side 28a of the shutter 28, may be manufactured using copper. According to some embodiments, the shutter has a thickness d of less than 4 mm, in a typical embodiment less than 2 mm. Then, the shutter is passively heated by the heating provided in the nozzle cover 22, when the shutter 28 is in the closed position.

According to yet further embodiments, which can be combined with other embodiments described herein, the shutter can be arranged within the guiding channel 26 such that the nozzle opening 24 is closed from the inner side of the nozzle cover 22. Thereby, according to alternative modifications, the shutter may be positioned with the evaporation tube 10 during an operation condition for which the opening 24 allows trespassing of material. Thereby, the environment to which the shutter 28 is exposed during operation is increased as compared to an outside position such that the shutter can be provided at high temperatures more easily.

Figure 5:
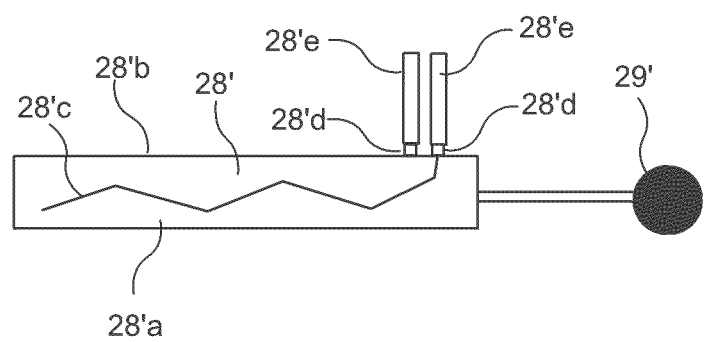
FIG. 5 shows an embodiment of a shutter.

FIG. 5 illustrates further embodiments with respect to alternative or additional modifications of a shutter in an evaporator described herein. FIG. 5 shows a shutter 28'. The shutter 28' has a first side 28'a that comes in contact with the nozzle cover 22 if the shutter 28' is in the closed position. The shutter includes a heating device 28'c adapted to heat at least the first side 28'a of the shutter 28'. In an embodiment, two contacts 28'd are provided in connection with the heating device 28'c of the shutter 28'. When the shutter is in the open position, the contacts 28'd are brought in an electrical contact with pins 28'e which are connected electrically to an electrical source and/or a control means for controlling the heating device 28'c. In a further embodiment, the electrical connection from the heating 28'c to the control means and/or the energy source may be provided through the axis 29' of the shutter.

Figure 6:
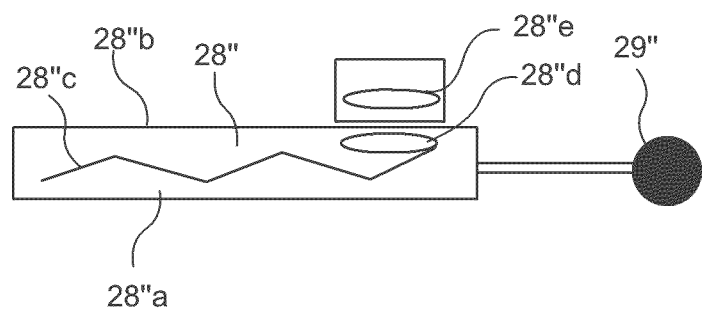
FIG. 6 shows a further embodiment of a shutter.

According to yet further embodiments, which can be combined with other embodiments described herein, as shown in FIG. 6, a contactless transmission of energy is provided from the energy source to a heating element 28"c in a shutter 28". A first coil 28"d is provided in the shutter 28" in electrical connection with the heating means 28"c. A second coil 28"e is adapted to transfer energy to the first coil 28"d and is arranged such that an energy transfer is possible in the open position of the shutter 28". In this embodiment, no contacts, like the contacts 28'd and the pins 28'e of the embodiment shown in FIG. 5 may get dirty or be coated by the organic material to be evaporated. Further, a housing of the second coil 28"e may act as stop for the shutter 28". Therefore, the non-contacting inductive power transmission provides a reliable heating system for the shutter 28".

Figure 7:
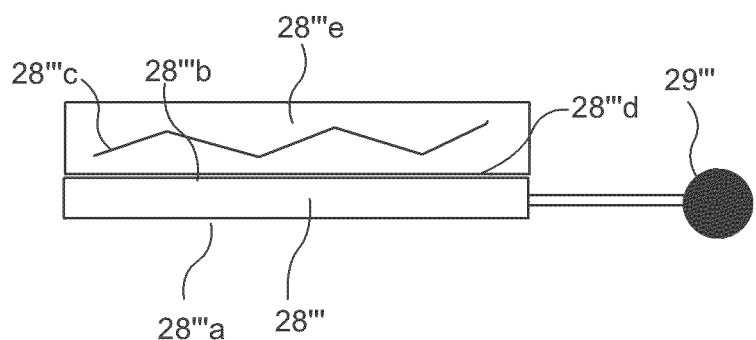
FIG. 7 shows another embodiment of a shutter.

According to yet further modifications, as shown in FIG. 7, a shutter 28''' is maintained in its open position, shown in FIG. 7, against a stop 28'''e containing a heating system 28'''c. The shutter 28''' has to be made sufficiently thin, such that in a short period of time, the first side 28'''a of the shutter 28''' is heated to the desired temperature, in particular a temperature about the same or more than the temperature of the nozzle cover 22. In an embodiment, the stop 28'''e substantially covers the complete surface of the second side 28'''b of the shutter 28'''. Further, the surface of the stop 28'''e and the second surface 28'''b of the shutter 28''' are conforming to each other to provide a good heat transmission from the stop 28'''e to the shutter 28'''.

Thereby, the shutter 28''' is passively heated in the open position by the stop 28'''e and in the closed position by the nozzle cover 22. For example, the shutter 28''' may have a heat conductivity of more than 15 W/m·K, typically more than 50 W/m·K or even 200 W/m·K.

According to yet further embodiments, which can be combined with other embodiments described herein, the heater or heating device for heating the evaporation tube 10 can be provided according to different implementations in order to have a more uniform heating of the evaporation tube. As explained above, a good heating uniformity, which might e.g., be provided by having a closed loop control system connected to the different heating elements described below, might be particularly relevant for organic materials such as melamine and the like, which have a small evaporation temperature range. Typically, the heating devices are in contact with the evaporation tube, such that they form a contact heating devices.

Figure 8:
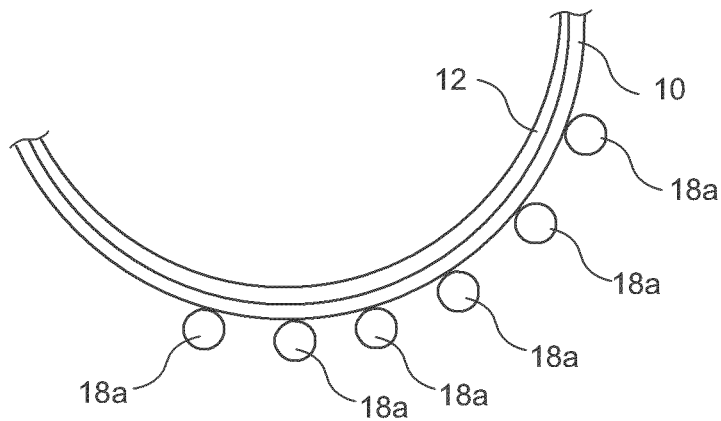
FIG. 8 shows an enlarged side view of an embodiment of an evaporation tube.

FIG. 8 shows a partial section of the evaporation tube 10. The crucible 12 is disposed in the evaporation tube 10. Outside the evaporation tube 10, heating elements 18a are provided to heat the evaporation tube 10. Inside the evaporation tube, the outer surface of the crucible 12 conforms substantially to the inner surface of the evaporation tube 10 to provide a good heat transfer from the evaporation tube 10 to the crucible 12. In particular, a typical organic material to be evaporated is melamine. Accordingly, evaporation temperatures may not exceed 330° C., or a corresponding temperature where melamine starts to burn under the operation parameters. According to some embodiments, the heating can be performed by heating tubes 18a.

Figure 9:
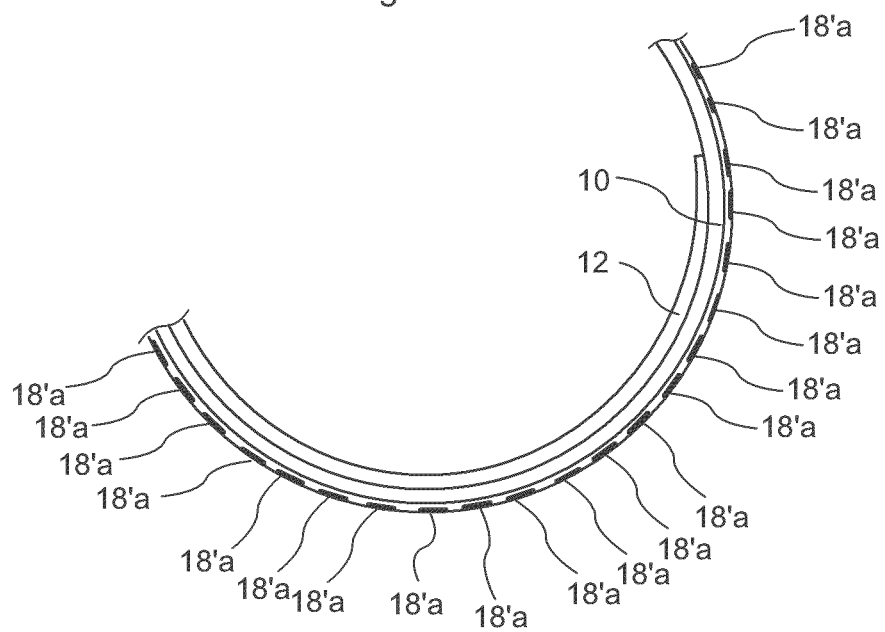
FIG. 9 shows an enlarged side view of a further embodiment of an evaporation tube.

According to yet further embodiments, as shown in FIG. 9, the evaporation tube is heated by thin film heating elements that are brought into contact with the outer side of the evaporation or vaporizer tube 10. The thin film heating elements 18'a are arranged on a substrate which provides the electrical connection to the heating elements 18'a. With thin film heating elements, a more uniform and adaptive heat distribution may be provided. According to an optional implementation, the surface of each heating element 18'a may depend on the position on the portion of the evaporation tube 10 to be heated. For example, smaller surface of heating elements may be provided at portions of the evaporation tube 10, which is not covered on its inner side with the crucible 12. In a typical embodiment, each thin film heating element may be controlled separately. Thus, the heat transfer to the organic material to be vaporized may be accurately controlled to provide a homogeneous heat introduction to the organic material in the crucible.

Figure 10:
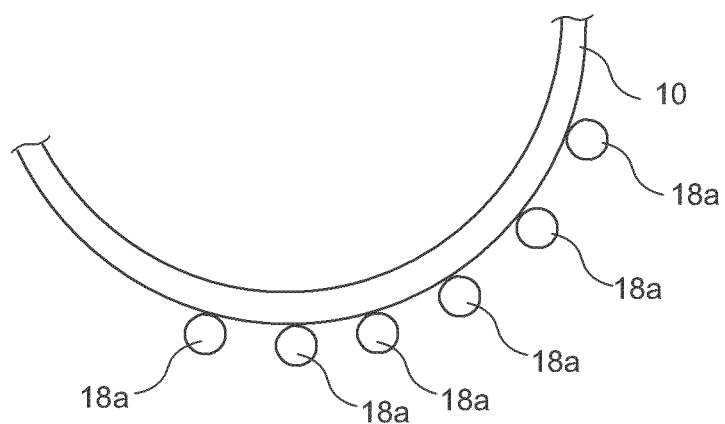
FIG. 10 shows an additional embodiment of an evaporation tube in side view.

According to some embodiments, the evaporation tube 10, which is for example shown in FIG. 9 and 10, can be manufactured using stainless steel. The crucible 12 is, in a typical embodiment, made of stainless steel, copper and/or aluminum. Thus, the heat transfer coefficient of the crucible and the evaporation tube is more than about $4.5 \times 10^3$ W/m²·K. In a typical embodiment, the evaporation tube has a wall thickness of about 3 mm and the wall of the crucible has a thickness of about 3 mm. The wall may have therefore a thickness of more than 6 mm. Thus, the heat that is provided by the heating devices or elements 18'a or 18a is distributed substantially homogenous on the inner side of the wall of the crucible 12, such that a homogeneous heat introduction to the organic material in the crucible is provided.

FIG. 10 shows a cross section illustrating further embodiments of the evaporation or vaporizer tube. As shown in FIG. 10, no crucible is placed into the vaporizer tube 10. According to yet further embodiments, which can be combined with other embodiments described herein, the thickness and the material of the evaporation tube 10 are selected such that it provides a heat transmission coefficient of about $4.5 \times 10^3$ W/m²·K and/or such that the all thickness of the evaporation tube 10 of FIG. 10 is about 6 mm. According to some modifications, the material can be copper or aluminum. Thereby, an improved heat uniformity can be provided as compared to the evaporation tube shown in FIG. 9 and the crucible can be omitted. With the usage of an evaporation or vaporizer tube omitting a crucible, a warming up cycle may be reduced, i.e., the time to reach the sublimation temperature of the organic material disposed in the evaporation tube is reduced compared to an evaporation tube containing a crucible.

According to yet further embodiments, which can result in further modifications of embodiments described herein, the thickness of wall of the evaporation tube may vary dependent on the location. For example, the wall of the evaporation tube 10 may have a bigger thickness at a lower part of the evaporation tube or the lower quadrant, where the material to be vaporized is placed. In the upper quadrant of the evaporation tube 10, the thickness of the wall of the evaporation tube may be lower than in the lower quadrant of the evaporation tube 10. In a typical embodiment, the evaporation tube is manufactured using copper and/or aluminum. Further, FIG. 10 shows heating elements or devices 18a in form of tubular heating elements. The heat that is provided by the heating devices or elements 18'a or 18a is distributed in a substantially homogenous manner on the inner side of the wall of the evaporation tube 10, such that a homogeneous heat introduction to the organic material disposed on the inner side of the wall of the evaporation tube 10 is provided. The embodiment of FIG. 10 may use thin film heating elements as shown in FIG. 9 in a further embodiment.

With respect to, e.g., FIG. 1 and FIGS. 8-9 evaporation tubes with and without a crucible inside have been described. Thereby, reference has been made to the heat conductivity of the wall of the evaporation tube in order to improve uniformity of the heat for evaporating the organic material. Thereby, it is to be understood that the heat conductivity has to be derived as a mean value of the wall of the evaporation tube and, if present, the wall of the crucible. Thus, if the thickness of the wall of the evaporation tube is the same to the thickness of the wall of the crucible, the mean heat conductivity is provided as the mean value of the heat conductivity of the evaporation tube material and the heat conductivity of the crucible. If, for example, the wall thickness of the evaporation tube would be 30% of the entire wall thickness and the wall thickness of the crucible would be the remaining 70% of the entire wall thickness, the heat conductivity would be a mean value weighted with 30% and 70% respectively. Accordingly, the mean heat conductivity can be understood as mean values of the wall portion weighted with the thickness of the portions of the wall.

According to even further embodiments, which can be combined with other embodiments described herein, the distance between the web and/or the flexible substrate to be coated with the organic material and the nozzle cover 12 can be sufficiently large to provide a space for an adhesion promoter-emitting device. Accordingly, an adhesion promoter device space is provided. Typically, the distance can be 80 mm or more. Accordingly, it is possible to place an adhesion promoter emitter between the evaporation tube 10 and the web/or substrate to be coated with the organic materials evaporated in the evaporation tube 10. Further, the greater distance between the nozzle cover 12 and the flexible web or substrate to be coated enables a greater uniformity of the material deposited on the web or substrate.

In light of the above, embodiments described herein, provide an improved evaporator for organic materials and an improved method for evaporating organic materials. This applies, in particular, for organic materials having a small available evaporation temperature range, such as melamine or the like. Thereby, at least one of the following aspects: the uniformity of the evaporation—in axial and/or cross-sectional direction—by improving heating uniformity, the condensation of material on the nozzle and the shutter, and the uniformity and adhesion on the flexible substrate can be improved.

Accordingly, a plurality of embodiments may include the above details and aspects. For example, an evaporator for vaporizing an organic material to be deposited on a flexible substrate is provided. The evaporator includes an evaporation tube having a wall encompassing a cavity for vaporizing the organic material, at least one heating device arranged adjacent to the wall and being adapted to heat the evaporation tube, and at least one nozzle assembly protruding from the evaporation tube. The nozzle assembly further includes a nozzle cover with an opening and a shutter for selectively opening and closing the opening of the nozzle cover. The shutter is adapted to have, during operation of the evaporation tube, a temperature within a shutter temperature range of 140° C. such that the temperature of the nozzle cover is within the shutter temperature range.

As another example, an evaporator for vaporizing organic materials is provided. In this embodiment, the evaporator includes an evaporation tube having a wall encompassing a cavity for vaporizing the organic material, at least one heating device arranged adjacent to the wall and being adapted to heat the evaporation tube, and at least one nozzle assembly protruding from the evaporation tube. The nozzle assembly further includes a nozzle cover with an opening and a shutter for selectively opening and closing the opening of the nozzle cover. The shutter is adapted to have, during operation of the evaporation tube, a temperature which is between a first temperature of 50° C. below the temperature of the nozzle cover and a second temperature of 50° C. above temperature of the nozzle cover.

According to further embodiments, which can include optional modifications, the shutter may have a first side and a second side, wherein the first side opposes the opening of the nozzle cover and wherein the first side of the shutter being adapted to be within the temperature ranges described above. According to further modifications of these embodiments, a shutter heater for heating at least a first side of the shutter may be provided. The shutter may have a thickness of 4 mm or less. Additionally, the shutter, in particular the first side, may have a heat conductivity of about 15 W/mK or more and/or the heat capacity of the first side of about $7.8 \times 10^3$ kJ/K per $m^2$ or less, and/or the nozzle cover may include at least one heating device for heating the nozzle cover.

According to yet further embodiments, which may be combined with any of the embodiments described herein, the evaporation tube may have, during operation, a substantial horizontal cylinder axis, wherein the cross section of the evaporation tube has two lateral quadrants, an upper quadrant, and a lower quadrant. In this embodiment, the at least one nozzle assembly is arranged at a lateral quadrant of the evaporation tube, such that, for example, the vaporized material can be directed in a substantially horizontal direction and/or the nozzle assembly may further include a guiding channel for guiding vaporized material from the evaporation tube to the opening of the nozzle cover. Thereby, according to further additional or optional modifications, the nozzle cover may be releasably connected to the guiding channel, and the opening of the nozzle cover may be a slit opening. Furthermore, the evaporation tube may have a mean width B and/or the guiding channel may have a length L in the guiding direction, wherein the ratio B/L may be at least 5. For example, the length L may be between about 30 mm to about 60 mm, in particular about 40 mm.

According to yet further embodiments, which can be combined with other embodiments described herein, the organic material can be melamine. Accordingly, the evaporator can be adapted to evaporate melamine, for example, in a temperature range of 200° C. to 350° C. and with a uniformity of ±10% of the evaporation temperature, typically of ±5% or even 3%. According to yet further additional or alternative implementations, the opening of the nozzle cover can have a distance of from the flexible substrate to provide a space for an adhesion promoter evaporation device, for example 100 mm or less, such as 80 mm.

According to another embodiment, an evaporator for vaporizing melamine to be deposited on a flexible substrate is provided. The evaporator includes an evaporation tube having a wall encompassing a cavity for vaporizing the melamine, at least one heating device arranged to heat the evaporation tube, and the evaporation tube having at least one nozzle assembly. The wall has a mean thermal conductivity of about 220 W/mK or more, and a thickness of 6 mm or more. According to yet further embodiments, which can be combined with other embodiments described herein, the wall may include an inner wall and an outer wall, the inner wall being the wall of a crucible, wherein the at least one heating device may be in contact with the evaporation tube. Additionally, the evaporator may include at least two heating devices, one spatially disposed after the other in a longitudinal direction, wherein the at least two heating devices are separately electrically controllable. The crucible may be shaped to conform to the inner walls of the evaporation tube.

According to another embodiment, a method for evaporating melamine is provided. The method includes heating melamine in an evaporation tube to a temperature such that the melamine is vaporized. The evaporation tube includes a wall encompassing a cavity for vaporizing the melamine and at least one nozzle assembly protruding from the evaporation tube, wherein the nozzle assembly further includes a nozzle cover with an opening and a shutter having a closed position and an open position. In the closed position, the opening of the nozzle is substantially closed and in the open position, the melamine can pass through the opening. The method further includes moving the shutter from the closed position to the open position; and heating the shutter to a temperature which is between a first temperature of 50° C. below the temperature of the nozzle cover and a second temperature of 50° C. above temperature of the nozzle cover. According to another optional implementation, which may be combined with any of the embodiments described herein, the shutter may be heated in various ways, including: a passive heating by the temperature of the environment adjacent to the shutter, a passive heating by the temperature of the nozzle cover, an active heating by a heating device placed adjacent to the shutter, an active heating by a heating device placed in the shutter, or combinations thereof. As a further additional or alternative modification of the above methods, the shutter may be moved from the open position to the closed position.

According to yet another embodiment, an evaporator adapted for vaporizing melamine on a flexible substrate is provided. The evaporator includes an evaporation tube having a wall encompassing a cavity for vaporizing the melamine, at least one heating device arranged adjacent to the wall and being adapted to heat the evaporation tube to a temperature in a range of 200° C. to 350° C. and with a temperature uniformity of ±3% of the temperature of the evaporation tube, and at least one nozzle assembly protruding from the evaporation tube. The nozzle assembly further includes a nozzle cover with an opening and a shutter for selectively opening and closing the opening of the nozzle cover. The shutter is adapted to have, during operation of the evaporation tube, a temperature which is between a first temperature of 50° C. below the temperature of the nozzle cover and a second temperature of 50° C. above temperature of the nozzle cover where either a shutter heater for heating the shutter is provided or the shutter has a thickness of 4 mm or less.

While the foregoing is directed to embodiments of the present invention, other and further embodiments of the invention may be devised without departing from the basic scope thereof, and the scope thereof is determined by the claims that follow.

The invention claimed is:

1. An evaporator for vaporizing an organic material to be deposited on a flexible substrate comprising:
    an evaporation tube having a wall encompassing a cavity for vaporizing the organic material;
    at least one heating device arranged adjacent to the wall and being adapted to heat the evaporation tube;
    at least one nozzle assembly protruding from the evaporation tube, wherein the nozzle assembly further comprises a nozzle cover with an opening; and
    a shutter for selectively closing the opening of the nozzle cover by contacting the nozzle cover and opening the opening of the nozzle cover, wherein the shutter is adapted to have, during operation of the evaporation tube, a temperature within a shutter temperature range of 140° C. such that the temperature of the nozzle cover is within the shutter temperature range.

2. The evaporator according to claim 1, further comprising a shutter heater for heating at least a first side of the shutter.

3. The evaporator according to claim 1, wherein the shutter has a thickness of 4 mm or less.

4. The evaporator according to claim 1, wherein the shutter has a heat conductivity of about 15 W/mK or more and/or a heat capacity of about $7.8 \times 10^3$ kJ/K per $m^2$ or less.

5. The evaporator according to claim 1, wherein the nozzle cover includes at least one heating device for heating the nozzle cover.

6. The evaporator according to claim 1, wherein the evaporation tube has, during operation, a substantial horizontal cylinder axis and a cross section of the evaporation tube has two lateral quadrants, an upper quadrant, and a lower quadrant, wherein the at least one nozzle assembly is arranged at a lateral quadrant of the evaporation tube.

7. The evaporator according to claim 6, wherein the vaporized material is directed in a substantially horizontal direction.

8. The evaporator according to claim 1, wherein the nozzle assembly further comprises a guiding channel for guiding vaporized material from the evaporation tube to the opening of the nozzle cover.

9. The evaporator according to claim 8, wherein the evaporation tube has a mean width B and the guiding channel has a length L in a guiding direction, wherein the ratio B/L is at least 5.

10. The evaporator according to claim 9, wherein the length L is between from about 30 mm to about 60 mm.

11. The evaporator according to claim 1, wherein the nozzle cover is releasably connected to the guiding channel.

12. The evaporator according to claim 1, wherein the opening of the nozzle cover comprises a slit opening.

13. The evaporator according to claim 1, wherein the organic material is melamine.

14. The evaporator according to claim 1, wherein the opening of the nozzle cover has a distance from the flexible substrate to provide a space for an adhesion promoter evaporation device.

15. An evaporator for vaporizing melamine to be deposited on a flexible substrate comprising:
   an evaporation tube having a wall encompassing a cavity for vaporizing the melamine, the evaporation tube having at least one nozzle assembly; and,
   at least one heating device arranged to heat the evaporation tube;
   wherein the wall comprises an inner wall and an outer wall, the inner wall being the wall of a crucible whose outer surface substantially conforms to the inner surface of the evaporation tube, and wherein the wall has a mean thermal conductivity of about 200 W/m·K or more and a thickness of 6 mm or more.

16. The evaporator according to claim 15, wherein the at least one heating device is in contact with the evaporation tube.

17. The evaporator according claim 15, wherein the evaporator comprises at least two heating devices, one spatially disposed after the other in a longitudinal direction, wherein the at least two heating devices are separately electrically controllable.

18. An evaporator adapted for vaporizing melamine on a flexible substrate comprising:
   an evaporation tube having a wall encompassing a cavity for vaporizing the melamine;
   at least one heating device arranged adjacent to the wall and being adapted to heat the evaporation tube to a temperature in a range of 200° C. to 350° C. and with a temperature uniformity of ±10% of the temperature of the evaporation tube;
   at least one nozzle assembly protruding from the evaporation tube, wherein the nozzle assembly further comprises a nozzle cover with an opening; and
   a shutter for selectively opening and closing the opening of the nozzle cover, wherein the shutter is adapted to have, during operation of the evaporation tube, a temperature which is between a first temperature of 50° C. below the temperature of the nozzle cover and a second temperature of 50° C. above temperature of the nozzle cover, and wherein either a shutter heater for heating the shutter is provided or the shutter has a thickness of 4 mm or less.

* * * * *